(12) United States Patent
Albarakaty

(10) Patent No.: US 9,318,348 B2
(45) Date of Patent: Apr. 19, 2016

(54) FABRICATION OF GRAPHENE ELECTRODES ON DIAMOND SUBSTRATE

(71) Applicant: KING ABDULAZIZ UNIVERSITY, Jeddah (SA)

(72) Inventor: Hussain A. Albarakaty, Jeddah (SA)

(73) Assignee: KING ABDULAZIZ UNIVERSITY, Jeddah (SA)

( * ) Notice: Subject to any disclaimer, the term of this patent is extended or adjusted under 35 U.S.C. 154(b) by 0 days.

(21) Appl. No.: 14/221,169

(22) Filed: Mar. 20, 2014

(65) Prior Publication Data
US 2015/0270358 A1  Sep. 24, 2015

(51) Int. Cl.
*H01L 21/265* (2006.01)
*H01L 21/324* (2006.01)
*H01L 29/16* (2006.01)

(52) U.S. Cl.
CPC .......... *H01L 21/324* (2013.01); *H01L 21/2652* (2013.01); *H01L 29/1606* (2013.01); *H01L 2021/26573* (2013.01)

(58) Field of Classification Search
CPC ............................................. H01L 2021/26573
See application file for complete search history.

(56) References Cited

U.S. PATENT DOCUMENTS

| | | |
|---|---|---|
| 7,781,061 B2 | 8/2010 | Garcia et al. |
| 8,318,268 B2 | 11/2012 | Lee et al. |
| 2009/0200707 A1 * | 8/2009 | Kivioja et al. ................. 264/293 |
| 2012/0181501 A1 | 7/2012 | Sung |
| 2013/0273720 A1 | 10/2013 | Sumant et al. |

OTHER PUBLICATIONS

Kurihara, Noriko Iwasaki et al., "Epitaxial Growth of Graphite Layer on {111} Surface of Vapor-Deposited Diamond," Journal of Applied Physics, 1991, 69, 6360-6363.
C. Uzan-Saguy, C. Cytermann, R. Brener, V. Richter, M. Shaanan, and R. Kalish, "Damage threshold for ion-beam induced graphitization of diamond," *Appl. Phys. Lett.*, vol. 67, pp. 1194-1196, 1995.
Yu, Jie et al., "Graphene-on-Diamond Devices with Increased Current-Carrying Capacity: Carbon sp2-on-sp3 Technology", Nano Letters, 2012, 12, 1603-1608.
K. S. Novoselov, A. K. Geim, S. V. Morozov, D. Jiang, Y. Zhang, S. V. Dubonos, I. V. Grigorieva, and A. A. Firsov, "Electric field effect in atomically thin carbon films," *Science*, vol. 306, pp. 666-669, 2004.

* cited by examiner

*Primary Examiner* — Cheung Lee
(74) *Attorney, Agent, or Firm* — Richard C. Litman

(57) ABSTRACT

One or more graphene layers may be formed on a diamond substrate by reforming $sp^3$ hybrid orbitals of C—C bonds in a portion of the diamond substrate into $sp^2$ hybrid orbitals. Forming $sp^2$ hybrid orbitals may be achieved by ion bombardment to damage the $sp^3$ hybrid orbitals of the C—C bonds in the diamond substrate and subsequent heating of the diamond substrate to allow annealing to take place. If more than ten graphene layers are formed on the diamond substrate, the graphene layers may be reduced to ten or less graphene layers. Removal of the graphene layers may be performed by peeling a desired number of layers using an adhesive material.

4 Claims, 2 Drawing Sheets

FABRICATION OF GRAPHENE ELECTRODES ON DIAMOND SUBSTRATE

BACKGROUND OF THE INVENTION

1. Field of the Invention

The present invention relates to a method for forming one or more graphene layers on a substrate. The method particularly relates to forming graphene from a treated portion of a diamond substrate.

2. Description of the Related Art

Recently, there has been much interest in a material known as graphene. Graphene is believed to be formed of a plane of carbon atoms that are $sp^2$-bonded carbon to form a regular hexagonal lattice with an aromatic structure, such as a honeycomb crystal lattice. Graphene typically refers to a single planar sheet of covalently bonded carbon atoms and specifically refers to one sheet of graphite, i.e., the (0001) surface of graphite. Graphene can refer to one layer but can also refer to a number of layers less than ten layers. Graphite is made up of stacked layers of graphene bonded together by Van der Waals forces.

The interest in graphene is due, in part, to the potential uses of graphene in electronic devices. The ability to increase the speed and performance of electronic devices are at the heart of modern electronics. Graphene is a promising material for future electronics owing to its high carrier mobility, saturation velocity, electrical conductivity, thermal conductivity, and ability to integrate with almost any substrate. Attempts have been made to incorporate graphene into electronic devices, such as transistors, however such attempts have generally been unsuccessful due to problems associated with the production of high quality graphene layers of a size suitable for incorporation into such devices.

Graphene transistors are expected to enable the creation of computer chips that are hundreds of times faster than the current silicon-based parts. The main breakdown mechanism of graphene is mostly due to the Joule heating, which depends upon the thermal conductivity and surface roughness of the underlying substrate. Graphene on diamond substrates have attracted attention for their expected use in electronic devices as they are expected to have a higher conductivity on diamond substrate than silicon or carbide. The thermal conductivity of natural diamonds is around 22 W/(cm·K) and the thermal conductivity of synthetic diamonds is around 30 W/(cm·K), which makes diamond five to seven times better at conducting heat than copper. Graphene electrodes on diamond substrates are also expected to be more durable than metal electrodes on diamond substrates, the metal electrodes which are known to have poor adhesion with diamond due to inertness.

Thus, a method of fabrication of a graphene layer on a diamond substrate is desired.

SUMMARY OF THE INVENTION

The fabrication of graphene on a diamond substrate may include a step of transforming $sp^3$ hybrid orbitals of C—C bonds in a portion of the diamond substrate into $sp^2$ hybrid orbitals. Transforming the $sp^3$ hybrid orbitals of the C—C bonds in the diamond substrate to $sp^2$ hybrid orbitals may be achieved by ion bombardment to damage the $sp^3$ bonds and subsequent heating of the diamond substrate to allow annealing to take place. Transforming $sp^3$ bonds to $sp^2$ bonds may also be achieved using a high power laser. One or more graphene layers may be formed on the diamond substrate as a result of formation of the $sp^2$ hybrid orbitals. If ten or more graphene layers (i.e., graphite) are formed, the graphene layers may be reduced to from about 1 to about 10 graphene layers. The reduction of the graphite layer on the diamond substrate to a predetermined number of graphene layers may be achieved by removal of a desired number of graphene layers using an adhesive material. Graphene on the diamond substrate may be used as an electrode for diamond-based devices or as starting material for fabrication of graphene-based electronics. In the latter case, the diamond may serve as a supportive substrate and heat dissipater. The graphene layer possesses one or more properties desirable for electronic applications, such as high conductivity, transparency, diamond matching atomic number, and low thickness.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
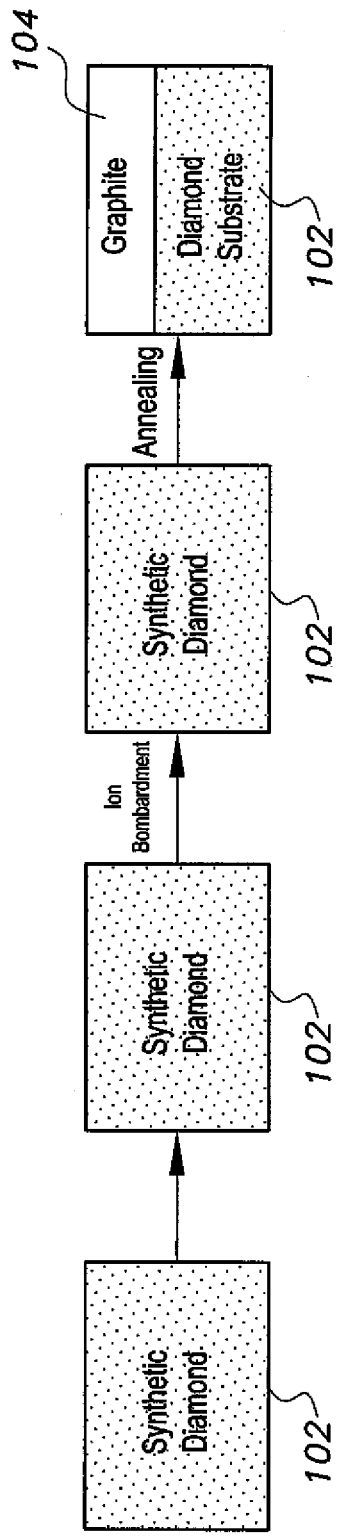
FIG. 1 is illustrates a schematic diagram of steps to form graphite on a diamond substrate, according to the present invention.

Graphene-based devices can be fabricated by forming graphene directly on a diamond, e.g., natural or synthetic diamond substrate. The diamond may serve as a substrate and as a heat sink. Directly forming graphene on a diamond substrate obviates the need for separately transferring or depositing graphene on a diamond substrate. The present method also does not require the transfer of another metal, such as a transition metal, onto the substrate, or treatment for the diamond surface, like smoothing.

Forming graphene layers on the diamond substrate may be accomplished by reforming $sp^3$ hybrid orbitals of the C—C bonds in a portion of the diamond substrate to $sp^2$ hybrid orbitals. The thickness of the graphene layers may be controlled, for example by ion species, energy, and/or implantation conditions. If the number of graphene layers formed exceeds the desired graphene layers, i.e., if graphite is formed, one or more graphene layers may be removed to reduce the number of graphene layers to the desired number of graphene layers.

Any suitable method may be used to transform the $sp^3$ hybrid orbitals to $sp^2$ hybrid orbitals. Preferably, the $sp^3$ hybrid orbitals of the C—C bonds are transformed with treatment by ion bombardment. The transformation of the $sp^3$ hybrid orbitals to $sp^2$ hybrid orbitals may also be accomplished by using a high power laser. Using the preferred method of ion bombardment, the ion bombardment damages or breaks the $sp^3$ bonds of the carbon atoms in the treated substrate portion. Preferably, damage to the $sp^3$ bonds of the carbon atoms should exceed a threshold defect density, e.g., $1 \times 10^{22}$ vacancy/cm$^3$. Ion bombardment may be followed by annealing. During annealing, the substrate is subjected to a temperature of about 600° C. to about 900° C., e.g., 800° C., for about 2 to 10 minutes, e.g., 5 minutes. The substrate is then allowed to cool. Annealing allows the broken $sp^3$ bonds to reform into sp² bonds. The treated portion of the substrate may thereby be transformed into one or more graphene layers.

The number of graphene layers formed on the substrate may be reduced if the number of layers formed exceeds the desired number of graphene layers (or if graphite is formed). In other words, if the transformed substrate portion is graphite, the graphene layers may be reduced. As is generally known, graphite includes more than ten graphene layers, e.g., hundreds of thousands of layers of graphene. Graphene may be one single layer of graphite, i.e., a one-atom thick layer of sp² bonded carbon atoms, or may include more than a single layer of graphite, for example up to 10 layers of graphite.

Removal of the graphene layers may be accomplished by a number of methods, such as chemical, and/or micromechanical methods. A suitable micromechanical method may include, for example, peeling off layers of graphene using an adhesive material, for example. Any suitable adhesive material may be used. For example, scotch tape may be used to peel the graphene layers from the substrate. The shape and size of the graphene layer can also be controlled using photolithography prior to graphitization. Also, electron lithography or proton beam writing can be used to define the graphitization pattern, which will define the graphene layer after exfoliation. Using a suitable lithography techniques, graphene nanoribbons can be introduced.

FIG. 1 describes the transformation stages of a portion of a diamond substrate to graphite, according to an embodiment. The process may begin with a starting diamond substrate 102, such as a synthetic diamond. The starting diamond substrate may be any suitable diamond or carbon based substrate. A synthetic diamond may be used, for example. The synthetic diamond may include a single crystal diamond (SCD), ultrananocrystalline diamond (UNCD), or a nanocrystalline (NCD) diamond. Once the diamond is obtained, the diamond substrate 102 (all or a portion of the diamond substrate 102) may be treated by ion bombardment to damage the sp³ hybridized carbon bonds. The damage should exceed a threshold defect density. The diamond substrate 102 may then be heated to allow annealing to take place. The substrate 102 may be heated in an oven or gas fired conveyor furnace, for example. After annealing, a portion of the synthetic diamond 102 may be transformed into graphite 104. The heated substrate may be allowed to cool before thickness of the graphite is measured.

Figure 2:
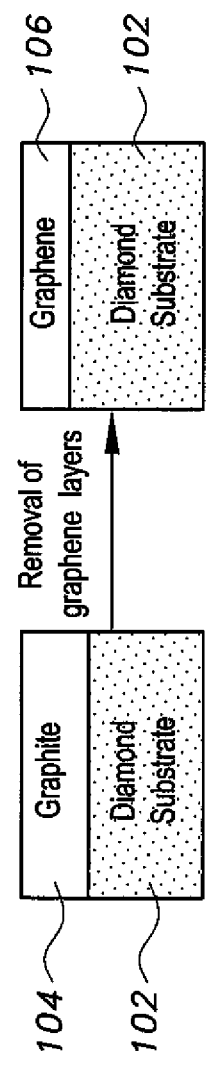
FIG. 2 is illustrates a schematic diagram of steps to form graphene on a diamond substrate, according to the present invention.

Referring to FIG. 2, one or more layers of the graphite 104 on the diamond substrate 102 may be reduced to a predetermined number of graphene layers 106 by a removal or exfoliation process. The adhesive material can be applied directly on a top surface of the graphite 104. One or more graphene layers will adhere to the adhesive material and be removed from the substrate upon removal of the adhesive material. An adhesive material, e.g., scotch tape, may be applied to and removed from the substrate in this manner until the desired thickness of graphene 106 is achieved. The thickness of graphene 106 on the substrate can be measured by any suitable electronic, visual, optical microscope, laser, or mechanical system used for measurement.

As described above, ion bombardment and annealing can be utilized to form graphene layers directly on the diamond substrate. The sp³ bonds of the treated portion of the diamond substrate may be broken by the ion bombardment. It should be understood that the sp³ bonds may be broken by any suitable means, e.g., ion implantation, chemical vapor deposition, sputtering, or laser. Also, it should be understood that the graphite layer can be patterned prior to ion implantation by, for example, photolithography. Electron lithography or proton beam writing can be used to make patterns on the nanometer scale. If photolithography is utilized, it is preferable that the thickness of the photoresist be more than the range of ions in the photoresist. Electron lithography or proton beam writing can be used to make a pattern in nanometer scale.

The graphene layer possesses properties such as high conductivity, transparency, hardness, diamond matching atomic number, and low thickness, which may facilitate use in a number of applications. Graphine, made according to the present teachings, may be useful in phototonics, high frequency and high power electronics, and radiation sensors, for example. The graphene layer on the diamond substrate may serve as an electrode for diamond based devices, such as radiation detectors and various electronics. An electrode including one or more graphene layers (up to 10), may have significant durability and higher conductivity on a diamond substrate than conventional metal electrodes. Also, graphene's low atomic number and ultra-low thickness may have reduced attenuation in electrodes relative to metal contacts. As is generally known, metal contacts have poor adhesion with diamond due to their inertness, and heavy ions and low energy X-rays react strongly with high Z number materials. This causes attenuation of radiation in metallic electrodes before reaching the active volume of the semiconductor detectors.

Graphene is transparent in UV wavelengths which can improve the efficiency of UV detectors. Graphene, made according the present teachings, can also be useful for radiotherapy dosimetry, where it is desirable to have a dosimeter with atomic number close to the average atomic number of human soft tissue (i.e. the tissue equivalent dosimeters). Diamonds, with atomic number of six, is considered an ideal matching semiconductor. Other applications include integrated circuits or transistors, for example.

Figure 3:
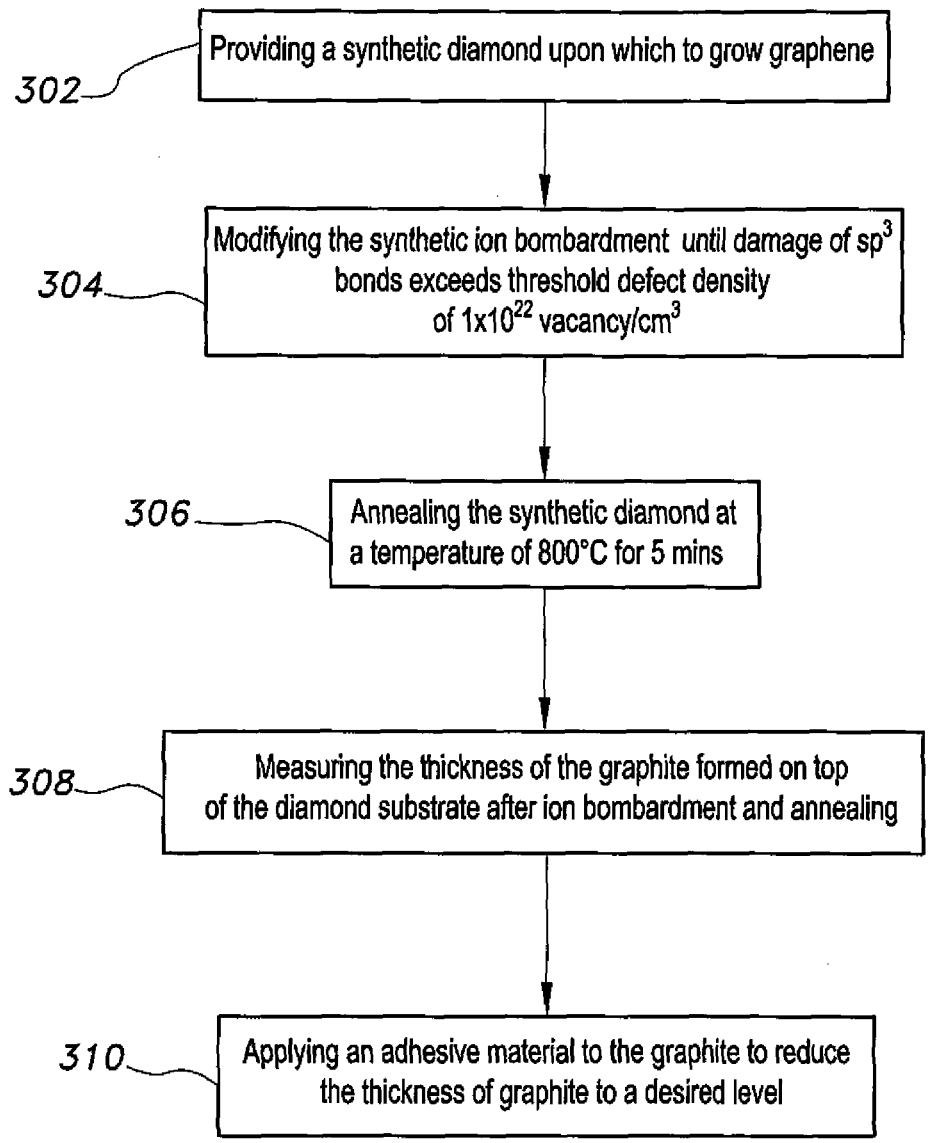
FIG. 3 is a flowchart illustrating a particular manner of forming graphene on a diamond substrate, according to the present invention.

FIG. 3 describes in detail a particular example of a method for growing graphene on a diamond substrate, according to the present teachings. A synthetic diamond substrate is provided 302 upon which to grow graphene. The synthetic diamond substrate is treated by ion bombardment 304 to cause damage to the sp³ hybridization of carbon atoms in the diamond. The damage exceeds a threshold defect density of $1 \times 10^{22}$ vacancy/cm³. The synthetic diamond substrate is placed into a vacuum furnace at a temperature of 800° C. for 4-5 minutes to allow annealing to occur 306. The thickness of the graphite on top of the diamond substrate can be measured 308 to determine whether to reduce the thickness of the graphite layer. The thickness may be determined under an optical microscope with the thickness checked by atomic force microscopy (AFM) measurements, transmission electron micrscopy (TEM) and Raman spectroscopy, for example. The thickness of the graphite layer may be reduced by an adhesive material 310.

Graphene formed according to the present teachings may be used as an electrode. The method of the present teachings includes directly forming one or more layers of graphene onto a carbon based structure, such as a natural diamond or synthetic diamond substrate. The method of the present teachings negates the need for transferring of another metal, such as a transition metal, onto the carbon based structure to form graphene.

It is to be understood that the present invention is not limited to the embodiments described above, but encompasses any and all embodiments within the scope of the following claims.

I claim:

1. A method of forming graphene on a synthetic diamond substrate, comprising:
   providing a synthetic diamond substrate selected from the group consisting of single crystal diamond, ultrananocrystal diamond, and nanocrystal diamond;
   defining a graphitization pattern on the synthetic diamond substrate prior to ion bombardment using photolithography;
   treating a portion of the synthetic diamond substrate by ion bombardment, the ion bombardment damaging $sp^3$ bonds of the carbon atoms in the treated substrate portion, wherein damage to the $sp^3$ bonds of the carbon atoms by ion bombardment exceeds a threshold defect density of $1\times10^{22}$ vacancy/cm3;
   heating the synthetic diamond substrate at an annealing temperature for about two minutes to about ten minutes to permit annealing to occur in the treated portion of the synthetic diamond substrate, wherein the annealing temperature is from about 600° C. to about 900° C. whereby the treated portion of the synthetic diamond substrate is transformed into one or more graphene layers; and
   reducing the one or more of graphene layers to ten or less graphene layers if the number of graphene layers formed exceeds ten.

2. The method according to claim 1, wherein the annealing temperature is about 800° C.

3. The method according to claim 1, wherein the substrate is heated for about five minutes.

4. The method according to claim 1, wherein the one or more graphene layers are removed by applying an adhesive material to the one or more graphene layers formed on the synthetic diamond substrate and peeling the adhesive material therefrom.

* * * * *